US 6,407,687 B2

(12) United States Patent
Martin et al.

(10) Patent No.: US 6,407,687 B2
(45) Date of Patent: Jun. 18, 2002

(54) SYSTEM AND METHOD FOR REDUCING TIMING MISMATCH IN SAMPLE AND HOLD CIRCUITS USING AN FFT AND SUBCIRCUIT REASSIGNMENT

(75) Inventors: David A. Martin, Atlantic Highlands, NJ (US); Mark C. Spaeth, Cambridge, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/887,624

(22) Filed: Jun. 22, 2001

Related U.S. Application Data

(60) Provisional application No. 60/214,564, filed on Jun. 28, 2000.

(51) Int. Cl.$^7$ ................................. H03M 1/00
(52) U.S. Cl. ..................... 341/122; 327/91; 327/94; 327/95; 341/122; 341/123
(58) Field of Search ................. 327/91, 94, 95; 341/122, 123

(56) References Cited

U.S. PATENT DOCUMENTS 4,612,533 A * 9/1986 Evans ..................... 340/347
4,804,863 A * 2/1989 Welland et al. ........... 307/227
5,184,127 A * 2/1993 Myers ....................... 341/122
5,481,212 A * 1/1996 Shima ......................... 327/94
5,521,599 A * 5/1996 McCarroll et al. ......... 341/122

* cited by examiner

Primary Examiner—Michael Tokar
Assistant Examiner—Khai Nguyen
(74) Attorney, Agent, or Firm—J. Dennis Moore; W. James Brady, III; Frederick J. Telecky, Jr.

(57) ABSTRACT

The present invention relates to a high speed sample and hold circuit which comprises a plurality of sample and hold subcircuits coupled in parallel between an input and an output. The circuit also comprises a calibration circuit coupled to the plurality of sample and hold subcircuits. The calibration circuit is operable to modify a hold signal for one or more of the plurality of sample and hold subcircuits to thereby reduce timing mismatch between the plurality of sample and hold subcircuits and distortion associated therewith. The present invention also comprises a method of reducing timing mismatch in a high speed, parallel coupled sample and hold circuit. The method comprises detecting timing mismatch associated with a plurality of sample and hold subcircuits and modifying a hold signal for one or more of the subcircuits. In one exemplary method, the timing mismatch is detected by converting the sample and hold circuit output data to digital data and performing a fast Fourier transform thereon, and analyzing the resulting energy spectrum.

28 Claims, 8 Drawing Sheets

SYSTEM AND METHOD FOR REDUCING TIMING MISMATCH IN SAMPLE AND HOLD CIRCUITS USING AN FFT AND SUBCIRCUIT REASSIGNMENT

This application claims priority under 35 USC § 119(e)(1) of provisional application Ser. No. 60/214,564 filed Jun. 28, 2000.

TECHNICAL FIELD

The present invention relates generally to electrical circuits, and more particularly to a system and method for reducing timing mismatch in sample and hold circuits.

BACKGROUND OF THE INVENTION

Analog to digital converters (ADCs) are important analog circuit devices which take an analog input signal and generate one or more digital signals which are representative of the analog input. ADCs are used in many applications such as communications applications in which the components receive a voice input (an analog input) and transform the voice date into a digital format for internal processing. Exemplary applications using such ADCs are illustrated in prior art FIGS. 1 and 2, respectively. For example, in prior art FIG. 1, an exemplary base transceiver station (BTS) 10 is illustrated in which an RF analog input signal 12 is received, amplified and converted into a digital signal 14 before being processed in a baseband section 16 and network interface section 18. Similarly, prior art FIG. 2 illustrates a schematic diagram of an automobile multimedia system 20 in which various analog signals such as radio signals 22 and sensor signals 24 are transformed into digital signals for subsequent processing. Further, many other system applications exist, including, but not limited to, hard disk drive (HDD) read channel applications.

One of the most challenging portions of an ADC is the sample and hold (S/H) circuit at the front end thereof. As the speed of ADCs continues to grow, the design of the S/H circuit becomes more challenging, and various solutions have been proposed to improve the speed of such S/H circuits. One prior art circuit solution for improving the speed of a S/H circuit is illustrated in prior art FIG. 3 and designated at reference numeral 30. The S/H circuit 30 consists of four S/H subcircuits 32a–32d coupled together in parallel. Each of the S/H subcircuits 32a–32d operates individually as a S/H circuit, wherein the input $V_{IN}$ is passed to the output $V_{OUT}$ during a "sampling mode" and the state of the input is maintained on the output in the "hold mode", respectively.

The speed of the S/H circuit 30 of FIG. 3 is increased by using several individual S/H subcircuits interleaved in time. An exemplary sample timing diagram for the S/H circuit 30 is illustrated in prior art FIG. 4. Note that with multiple S/H subcircuits interleaved in time, each subcircuit transitions through one sample and hold cycle in four clock (CLK) cycles, whereas if a similar speed were desired with only a single S/H subcircuit, the sample and hold functions each would have to be completed within a one-half (½) clock cycle. Therefore in the above parallel configuration, the overall speed is increased without requiring higher performance from the individual S/H subcircuit elements.

Referring again to prior art FIG. 3, although the pass gates at the output of the overall S/H circuit 30 might seem like a possible speed limitation, usually such S/H circuits are followed by one or more output buffers. In such a case, the RC filter of the pass gate and the input capacitance of the output buffer is usually fairly small compared with the speed gained through parallelism.

One problem with the technique provided by the circuit 30 of prior art FIG. 3 is that if the S/H subcircuits 32a–32d are not perfectly matched, then errors can occur. The three chief types of mismatch associated with the S/H circuit 30 are offset mismatch, gain mismatch and timing mismatch. A brief discussion of the operation of an individual conventional S/H subcircuit is provided below in order to appreciate the impact that timing mismatch has on the performance of the S/H circuits 30.

An exemplary prior art sample and hold subcircuit is illustrated in prior art FIG. 5, and designated at reference numeral 40. Circuit 40 is a detailed circuit of structure 32a in FIG. 3. Transistor M1 operates as a sampling switch, and $C_{HOLD}$ acts as a sampling capacitor. In the sampling mode, a sampling signal "S" is asserted, thereby closing a switch 42, which activates M1 (turns M1 on). With M1 on, $V_{IN}$ is passed to the output $V_{OUT}$.

A significant time point relating to timing mismatch in S/H circuits deals with the instant when the sampling switch M1 is deactivated, or turned off. Any deviation of the deactivation of M1 from perfect CLK/N time periods will cause a timing mismatch between the various subcircuits and result in distortion at the output $V_{OUT}$. To deactivate M1, the sample signal "S" goes low and a hold signal "H" is asserted, which causes a switch 43 to close. This instance pulls the gate of M1 down to ground, thus turning M1 off. Each S/H subcircuit has its own hold signal "H"; consequently, a primary source of the timing mismatch relates to mismatches in the switch M1 driven by "H" and the arrival of the hold signal "H" at each subcircuit switch, respectively. In addition, even if no timing mismatch occurs between "H" signals of various subcircuits 32a–32d, a sizing mismatch of switch 43 or M1 between various subcircuits may exist which may contribute disadvantageously to timing mismatch.

There is a need in the art for a circuit and method for increasing the speed in sample and hold circuits in which timing mismatch is reduced substantially.

SUMMARY OF THE INVENTION

According to the present invention, a system and method of reducing timing mismatch in high speed S/H circuits is disclosed.

According to the present invention, timing mismatch related to the sampling switch in various S/H subcircuits is reduced by calibrating the subcircuits so that the hold signal of the subcircuits are modified so as to minimize timing mismatch between S/H subcircuits. In the above manner, the timing mismatch between the various S/H subcircuits associated with the arrival of the hold signal at its switch in each subcircuit is reduced substantially or eliminated altogether.

According to one aspect of the present invention, subcircuits within a parallel S/H circuit are calibrated so as to reduce timing mismatch by feeding a sinusoidal test signal into the analog input of a S/H circuit input and analyzing the circuit output. For example, the analog, generally sinusoidal output is converted to digital data and processed, for example, using a fast Fourier transform (FFT). The processed data, for example, an energy spectrum, is then analyzed and utilized to calibrate one or more of the S/H subcircuits by modifying the hold signal such that a timing mismatch between the S/H subcircuits is reduced substantially or eliminated altogether.

According to another aspect of the present invention, a high speed S/H circuit comprises a plurality of S/H subcircuits coupled together in parallel, a calibration circuit and a memory associated therewith. The calibration circuit is operable to modify a hold signal for each of the S/H subcircuits. In an exemplary illustration of the present invention, the calibration circuit operates to modify the hold signal of one or more S/H subcircuits so as to minimize an energy amplitude at one or more predetermined frequencies, thereby reducing distortion associated with timing mismatch. Based on the processing and analysis of the S/H circuit output, control data necessary to modify the hold ("H") signal for the one or more of the S/H subcircuits is identified and saved in the memory. Subsequently, the calibration circuit may access the memory and utilize the control data to modify the hold signal for one or more of the S/H subcircuits and thereby reduce timing mismatch.

According to still another aspect of the present invention, a method for reducing timing mismatch in a S/H circuit is provided. The method comprises modifying the hold signal for one or more of a plurality of S/H subcircuits. The modified hold signals are then employed within the respective S/H subcircuits to thereby reduce the timing mismatch therebetween, thus reducing output distortion. In an exemplary illustration of the present invention, the identification of the proper hold signal modifications is accomplished by inputting a sinusoidal signal into the input of the S/H circuit. The S/H output is then digitized, analyzed and used to determine a timing mismatch status. For example, an FFT is performed on the digital output data and the energy spectrum associated therewith is analyzed to ascertain whether timing mismatch exists, thereby establishing the status. The status is then used to modify the hold signal for the subcircuits independently of one another. For example, control data necessary to establish the desired modified hold signal for each S/H subcircuit is identified and saved in a memory and subsequently employed by a calibration circuit to effectuate the hold signal timing for each of the S/H subcircuits.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a system and method for reducing timing mismatch in high speed S/H circuits. In S/H circuits employing a plurality of time interleaved S/H subcircuits, timing mismatch is reduced via calibration by modification of the hold signal to thereby establish a predetermined timing relationship between each of the S/H subcircuits. According to one exemplary aspect of the present invention, the calibration is accomplished by inputting a sinusoidal test signal into the S/H circuit input and analyzing the circuit output. For example, the S/H circuit output is converted to digital data and processed, for example, using a signal analysis circuit to perform an FFT. The resulting energy spectrum is then analyzed to identify timing mismatch between the various S/H subcircuits. Such analysis is then used to modify the hold signal for one or more of the S/H subcircuits, respectively.

Figure 6A:
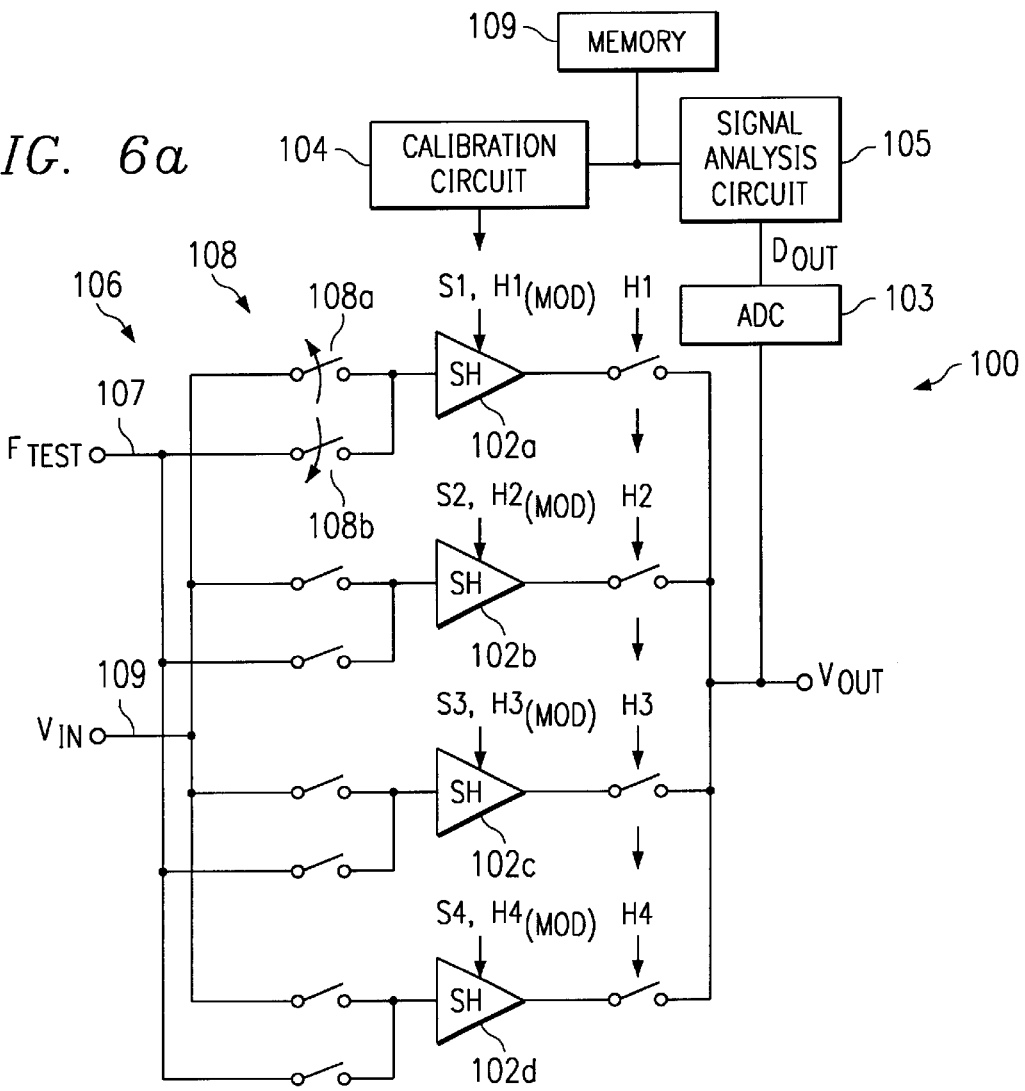
FIG. 6a is a schematic diagram illustrating a system for identifying timing mismatch and eliminating or reducing substantially such timing mismatch in a high speed S/H circuit according to the present invention.

Turning now to the figures, FIG. 6a is a schematic diagram illustrating a system or circuit for identifying and reducing timing mismatch in a high speed, parallel coupled S/H circuit, and is designated at reference numeral 100. The S/H circuit 100 includes a plurality of S/H subcircuits 102a–102d (e.g., four (4) subcircuits), which are coupled together in parallel between an input portion (which includes an analog input terminal $V_{IN}$) and an output terminal $V_{OUT}$. The S/H circuit 100 also includes an ADC 103, a calibration circuit 104, and a signal analysis circuit 105 associated with the S/H subcircuits 102a–102d, for example, coupled between the output $V_{OUT}$ and the input portion 106 of the circuit, respectively. The calibration circuit 104 is operable to calibrate the various S/H subcircuits 102a–102d by modifying the hold signal for one or more of the various S/H subcircuits, respectively. The calibration which results in the desired timing relationship between the subcircuits 102a–102d reduces the mismatch in the switches of the various S/H subcircuits 102a–102d which is driven by the hold signal and thus reduces timing mismatch between the S/H subcircuits 102a–102d and reduces distortion at the output $V_{OUT}$. The manner in which such functionality is effectuated will be described in greater detail below.

According to one aspect of the present invention, an analog input signal 107, for example, a sinusoidal signal $F_{TEST}$ having a predetermined test frequency, is selectively coupled to an input portion 106 of the S/H circuit 100. For example, as illustrated in FIG. 6a, $F_{TEST}$ is coupled to the input portion 106 through a switching arrangement 108.

The switching arrangement 108 may be controlled by a control circuit (not shown) which operates to open a first switch 108a to decouple the analog input signal $V_{IN}$ 109 from the input portion 106 of the S/H circuit 102a, and close a second switch 108b which couples the S/H circuit 102a to the input test signal 107. Therefore the S/H circuits 102a–102d may be selectively employed using the switching arrangement 108 so as to be coupled in a test calibration mode and be decoupled in a standard or conventional analog sampling mode, respectively.

In accordance with one aspect of the present invention, the test signal 107 is fed into the input portion 106 of the S/H circuit 102a–102d, thus replacing the analog input $V_{IN}$ with $F_{TEST}$. The S/H circuit 100 then operates in a conventional manner with the output ($V_{OUT}$) representing a status or state based upon the hold signal timing of the various subcircuits 102a–102d. That is, with no timing mismatch, the analog input signal 107 generally will be faithfully reproduced at $V_{OUT}$, whereas the existence of timing mismatch between the S/H subcircuits will cause some distortion of signal 107 at $V_{OUT}$.

Figure 6B:
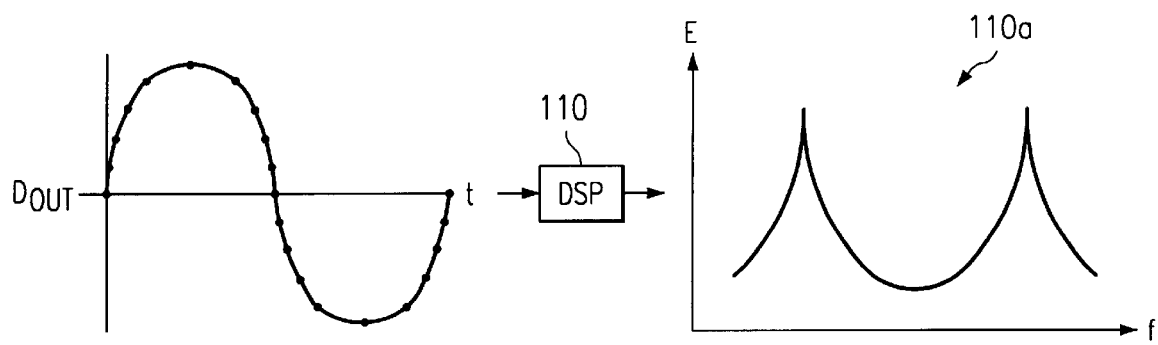
FIG. 6b is a combined waveform and block diagram illustrating a portion of an exemplary signal analysis circuit according to the present invention.
Figure 6C:
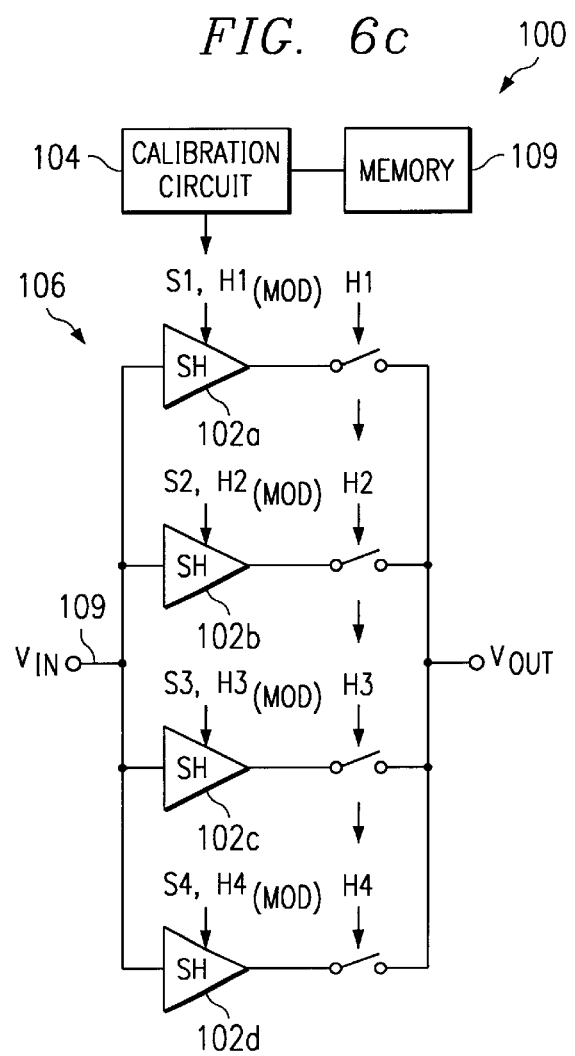
FIG. 6c is a schematic diagram illustrating a circuit for eliminating or reducing substantially timing mismatch in a high speed S/H circuit according to the present invention.

The analog output signal is then converted into digital data $D_{OUT}$ using the ADC 103 (see, e.g., the exemplary digital data $D_{OUT}$ illustrated in FIG. 6b). The digital data $D_{OUT}$ is then input into the signal analysis circuit 105 and analyzed to identify whether timing mismatch exists between the various S/H subcircuits 102a–102d. Based on the analysis performed by the signal analysis circuit 105, the calibration circuit 104 then modifies the hold signal (e.g., "H" modified to $H_{(MOD)}$) of one or more of the subcircuits 102a–102d. The modified hold signal(s) are then utilized to again sample the input ($F_{TEST}$) at the output, and the output $V_{OUT}$ is again reevaluated using the signal analysis circuit 105. This process continues using the signal analysis circuit 105 and the calibration circuit 104 until a timing of the hold signal(s) is established for each of the S/H subcircuits 102a–102d individually. The modified hold signal (e.g., a different $H_{(MOD)}$ for each of the S/H subcircuits 102a–102d) subsequently is then saved in a memory 109 as control data to effectuate calibration subsequently in conjunction with the calibration circuit 104. The calibration circuit 104 and the memory 109 are then utilized in a standard or conventional mode of operation to reduce the timing mismatch between the various S/H subcircuits 102a–102d, thereby reducing distortion associated therewith at the output $V_{OUT}$, as illustrated in FIG. 6c. Note that the signal analysis circuit 105 is no longer necessary once the control data needed for effective calibration has been identified.

As discussed above, the calibration circuit 104 of FIG. 6a operates to modify the hold signal associated with the various S/H subcircuits 102a–102d individually. Consequently, the manner and/or extent to which the hold signal associated with each S/H subcircuit 102a–102d is modified may differ from one another. According to one exemplary aspect of the present invention, the hold signals for the various S/H subcircuits 102a–102d are modified by delaying the hold signal by a given amount. Alternatively, however, other ways of modifying the hold signal may be employed and any such hold signal modifications are contemplated as falling within the scope of the present invention.

Various forms of signal analysis may be employed in the signal analysis circuit 105 of FIG. 6a to identify timing mismatch and any such signal analysis is contemplated as falling within the scope of the present invention. According to one exemplary aspect of the present invention, the signal analysis circuit 105 comprises a digital signal processor (DSP) circuit 110, as illustrated in FIG. 6b. The DSP circuit 110 is adapted or otherwise configured to perform a Fourier transform such as a fast Fourier transform (FFT) on the digital data $D_{OUT}$. As is generally well known, a Fourier transform takes a time-varying input signal (time domain signal) and transforms the signal into the frequency domain, wherein signal amplitudes vary across a range of frequencies. An FFT is a digital Fourier transform algorithm in which digital data $D_{OUT}$ is transformed into the frequency domain to thereby provide an energy spectrum 110a, as illustrated, for example, in FIG. 6b.

Figure 7A:
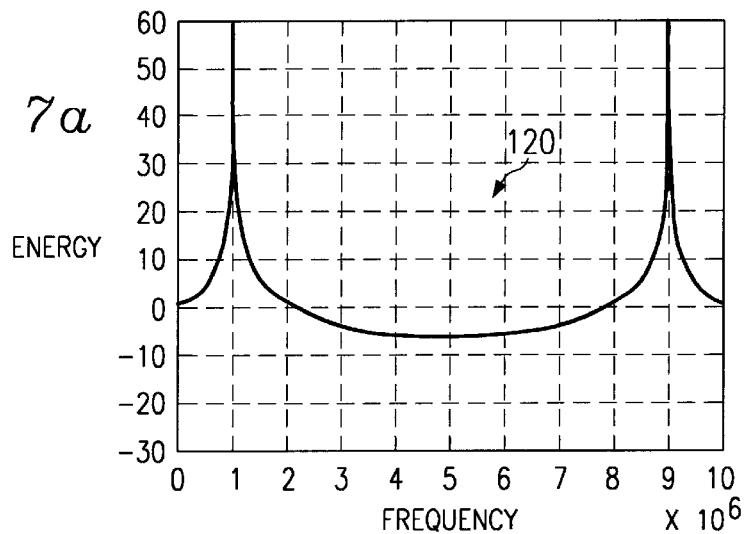
FIGS. 7a–7f are waveform diagrams illustrating exemplary energy spectra associated with output data of the circuit of FIG. 6b and how timing mismatch in a S/H circuit may be identified using such energy spectra according to the present invention.
Figure 7B:
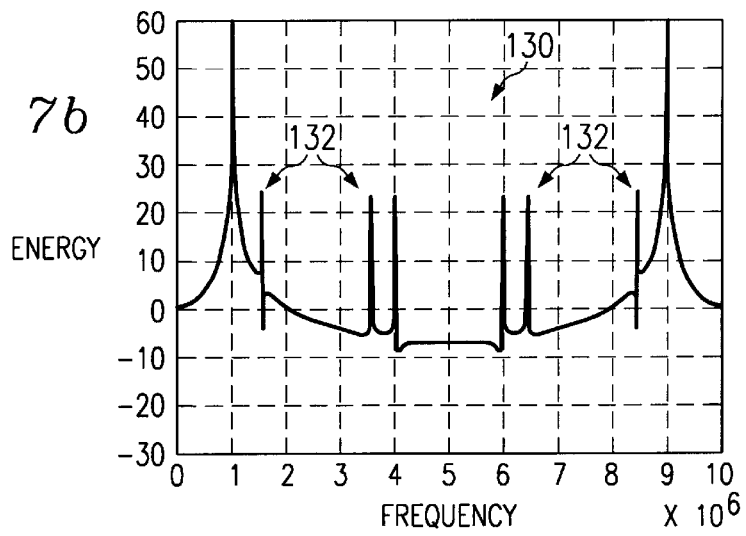

An exemplary energy spectrum resulting from a S/H circuit 100 exhibiting no timing mismatch (e.g., an ideal response) is illustrated in FIG. 7a, and designated at reference numeral 120. For the spectrum 120 of FIG. 7a, a 100 MHz input signal ($F_{TEST}$) has been sampled at 1000 MHz or 1 GHz ($f_{CLK}$). In contrast, an exemplary energy spectrum resulting from a S/H circuit exhibiting timing mismatch between two or more of the S/H subcircuits 102a–102d is illustrated in FIG. 7b, and designated at reference numeral 130. Note that the energy spectrum 130 exhibiting distortion due to timing mismatch differs from the ideal response spectrum 120 of FIG. 7a; in particular, energy spikes 132 exist at various frequencies (wherein the frequencies are a function of the input test signal frequency $f_{TEST}$ and the clock signal frequency $f_{CLK}$). Consequently, an effective calibration (hold signal modification) will minimize the energy spikes 132 at those frequencies, thereby causing the energy spectrum 130 of the digitized output $D_{OUT}$ to approach the ideal spectrum 120 of FIG. 7a. Since timing mismatch produces distortion at specific frequencies for a given $f_{TEST}$ and $f_{CLK}$, it is possible to reduce timing mismatch independent of other S/H nonidealities by examining the FFT output at those specific frequencies.

When analyzing the digital data $D_{OUT}$, if the S/H circuit 100 has more than two S/H subcircuits 102, there are a variety of possible mismatches and subsequent analysis of the energy spectrum (e.g., the spectrum 130 of FIG. 7b) can become challenging because of the difficulty in determining which S/H subcircuit 102 is the cause of the resulting distortion (caused by the timing mismatch). According to one exemplary aspect of the present invention, the above—identified problem is overcome by decimating the digital output data $D_{OUT}$ so that only the output of two of the S/H subcircuits is being analyzed at one time. For example, to evaluate whether S/H subcircuits 102a and 102b exhibit timing mismatch with respect to one another, $D_{OUT}$ is decimated so that only the digital data associated with the S/H subcircuits 102a and 102b are analyzed.

Figure 7C:
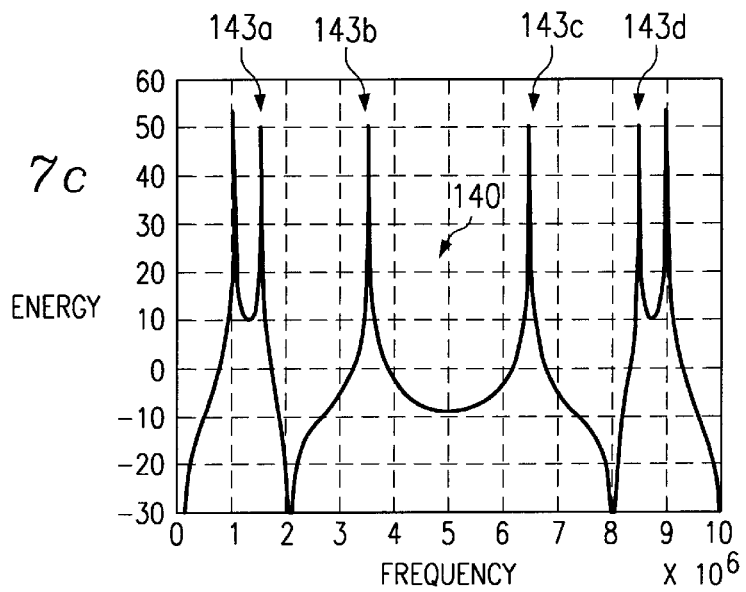
Figure 7D:
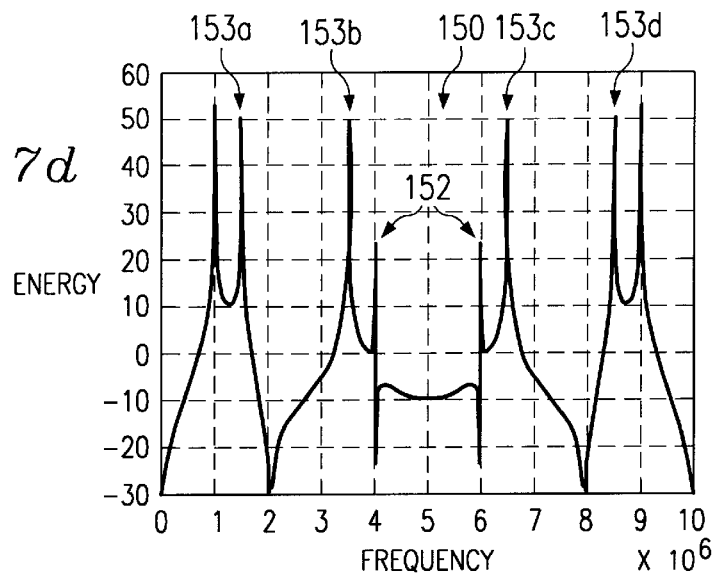
Figure 7E:
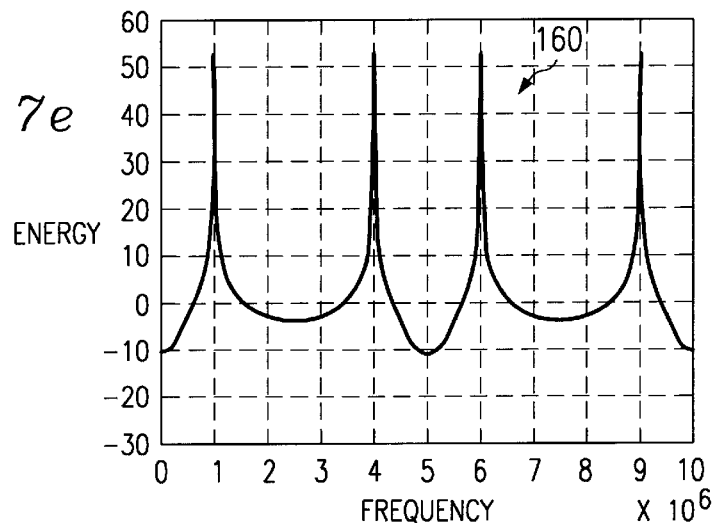
Figure 7F:
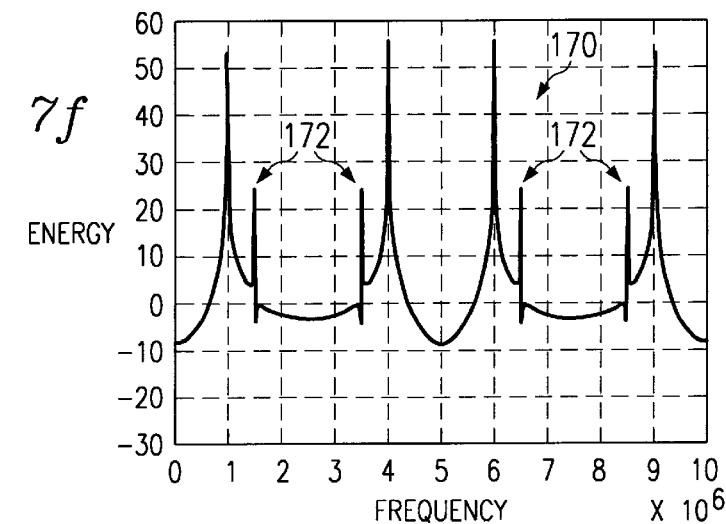

An exemplary energy spectrum of the decimated data when no timing mismatch exists (e.g., an ideal response) is illustrated in FIG. 7e, and designated at reference numeral 160. In contrast, an exemplary energy spectrum generated by the DSP circuit 110 which exhibits distortion due to timing mismatch is illustrated in FIG. 7f, and designated at reference numeral 170. Note that in FIG. 7f, the distortion shows up as energy spikes 172 at particular frequencies which are a function of the input test signal frequency $f_{TEST}$ and the clock frequency $f_{CLK}$ at which the S/H subcircuits operate, respectively. An effective calibration of either one or more of the S/H subcircuits 102a and 102c will result in the peaks 172 of FIG. 7f being minimized.

After decimating the digital data $D_{OUT}$ to analyze the timing relationship between two of the S/H subcircuits 102a and 102c, another decimation of $D_{OUT}$ is conducted between one of the same subcircuits (e.g., S/H subcircuit 102a), which may be considered the master, and another one of the S/H subcircuits (e.g., subcircuit 102b). One exemplary manner of accomplishing such a decimation is if there are M number of total S/H subcircuits, and M=$2^N$, where N is an integer (e.g., M=4, then N=2), make the first subcircuit 102a be the master and decimate the digital data by two until left with only the data associated with the master and the $[(M/2)+1]_{th}$ subcircuit. After performing the analysis with these subcircuits, one can re-map the physical S/H subcircuits 102b–102d so that a different S/H subcircuit is the $[(M/2)+1]^{th}$ subcircuit, for example, by re-routing the CLK signal lines. Therefore if M=4, then $D_{OUT}$ represents data from the S/H subcircuits as follows:

12341234123412341234 . . . ;

which is decimated in the above described manner to:

1313131313131313131313 . . .

Upon remapping the S/H subcircuits as described above, $D_{OUT}$ may be:

13241324132413241324 . . . ;

which is decimated in the above described manner to:

1212121212121212121212 . . . , and so on.

FIGS. 7e and 7f illustrate the above discussed decimation and analysis in accordance with one exemplary aspect of the present invention. FIG. 7e illustrates an energy spectrum 160 for decimated data, wherein the corresponding S/H subcircuits 102a and 102b exhibit no distortion due to timing mismatch (e.g., an ideal response). In the above example, the input test signal frequency $f_{TEST}$=100 MHz and the clock signal $F_{CLK}$=1 GHz. In addition, it is desired for signal analysis simplicity and stability to ensure that $f_{TEST} < f_{CLK}/2^{(N+1)}$ and $f_{TEST} \neq f_{CLK}/N$.

FIG. 7f illustrates an energy spectrum 170 associated with the same S/H subcircuits 102a and 102c, wherein timing mismatch (and thus distortion) does exist therebetween. Typically any timing mismatch for two subcircuits will appear at $f_{CLK}/2 \pm f_{TEST}$, however, due to the decimation described above, the mismatch (if any) will occur at $f_{CLK}/2 \pm f_{CLK}/4 \pm f_{TEST}$. Therefore the analysis of the energy spectrum 170, for example, will focus on the energy at those frequencies (e.g., 150 MHz, 350 MHz, 650 MHz and 850 MHz). Note that in FIG. 7f, energy spikes 172 reside at the frequencies of interest which indicates that calibration (modification of the hold signal for either or both subcircuit 102a and/or 102b) is needed in order to reduce the timing mismatch between the respective S/H subcircuits 102a and 102b. Upon calibration by the calibration circuit 104, the analysis described above is performed again with associated calibration and the process repeats until the energy at the frequencies of interest is minimized, for example, as shown in the ideal response spectrum 160 of FIG. 7e. The control data necessary to effectuate the desired condition is then saved in the memory 109 for subsequent S/H circuit 100 operation.

Figure 8:
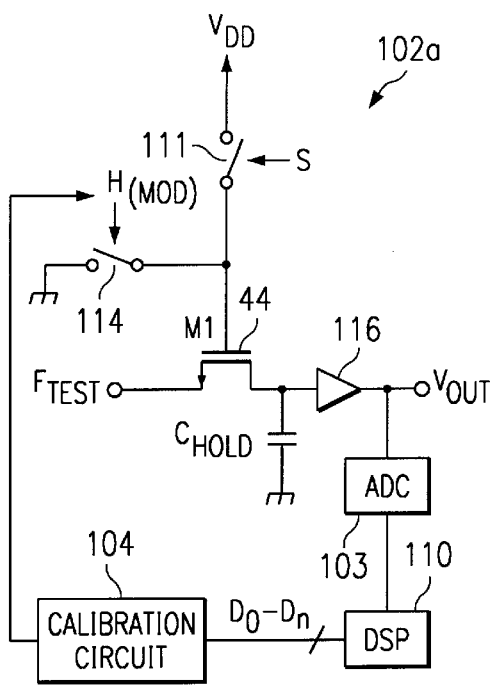
FIG. 8 is a combined block diagram and schematic diagram illustrating the calibration circuit and an exemplary subcircuit within the high speed S/H circuit of FIGS. 6a or FIG. 6c according to the present invention.

Turning now to the details of the calibration process, an exemplary S/H subcircuit 102a having the calibration circuit 104 (or alternatively a calibration subcircuit if each subcircuit employs its own calibration circuit) associated therewith is illustrated in greater detail in FIG. 8. The S/H subcircuit 102a includes a sampling switch M1 and a holding capacitor $C_{HOLD}$. In addition, the subcircuit 102a includes switches 111 and 114, respectively, as shown. The S/H subcircuit 102a operates in conjunction with the calibration circuit 104 in the following exemplary manner. When the sampling signal "S" is asserted (goes high) the switch 111 is closed, thereby coupling $V_{dd}$ to the gate of M1 and turning M1 on. At the same time "S" is asserted, the hold signal "H" is low, causing the switch 114 to be open. When M1 is on, the input (which may be the sinusoidal input signal $F_{TEST}$) is passed through M1, which is conducting, and a buffer 116 to the output $V_{OUT}$. Such S/H subcircuit operation constitutes the sampling mode.

When it becomes time to discontinue the sampling mode, the hold signal "H" goes high while the sampling signal "S" goes low, which closes the switch 114 and opens the other switch 111, respectively. The voltage state of the output $V_{OUT}$ is then held while M1 is off by the holding capacitor $C_{HOLD}$. Therefore during the above conditions, the S/H subcircuit 102a is in a "holding" mode of operation, wherein the state or status at the output is a function of the time at which the hold signal arrived at the switch 114 to close it which thus impacts the timing at which the circuit ground potential appears at node 44.

Figure 1:
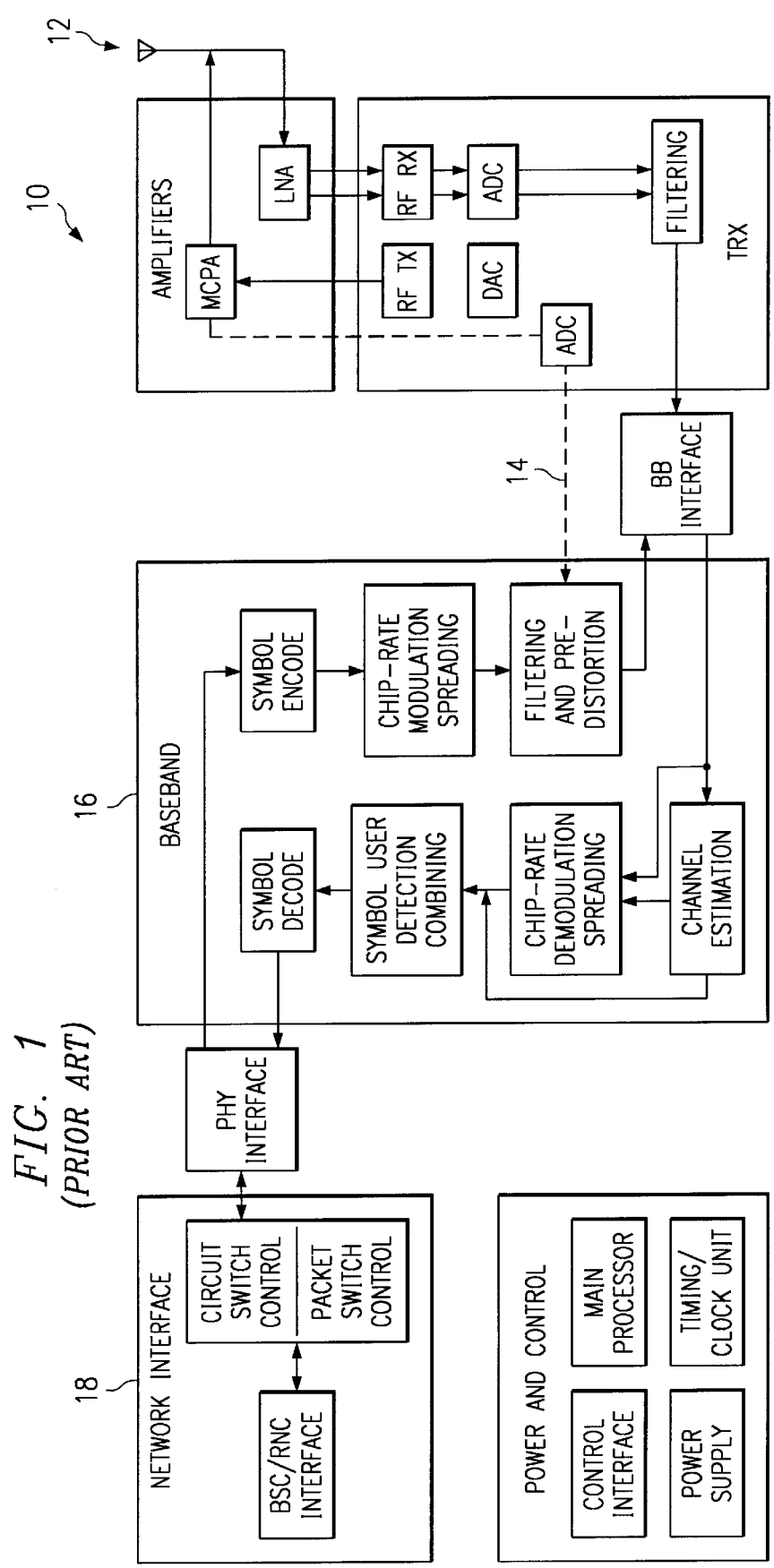
FIG. 1 is a block system level diagram illustrating a prior art base transceiver station utilizing a plurality of ADCs.
Figure 2:
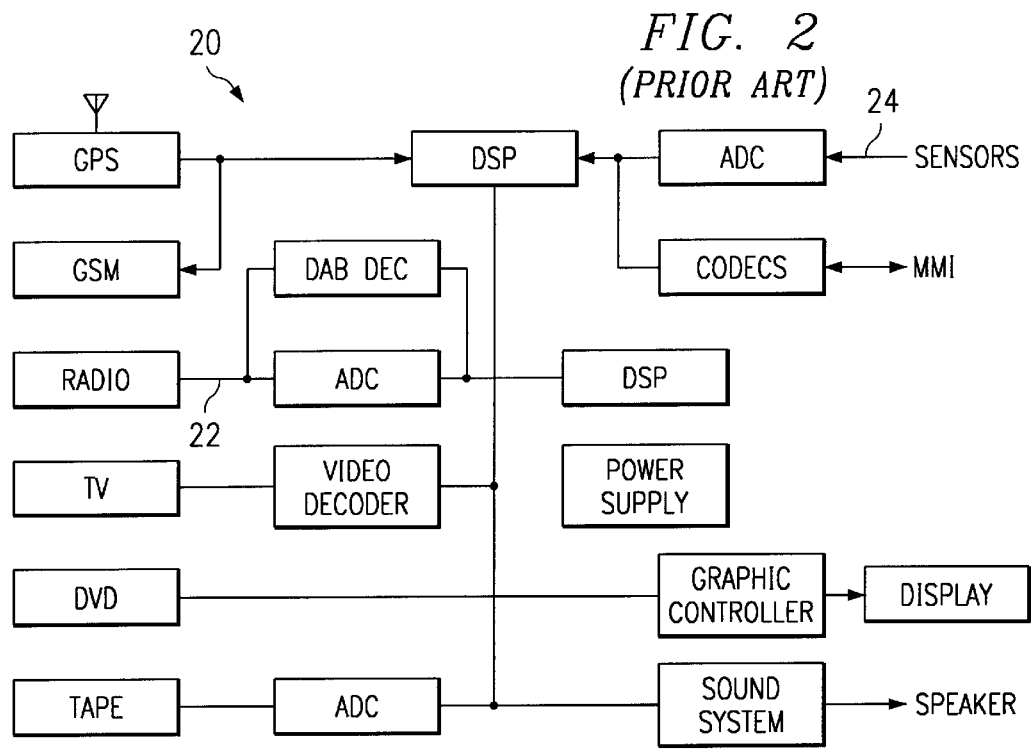
FIG. 2 is a block system level diagram illustrating a prior art multimedia controller for an automobile employing a plurality of ADCs.
Figure 3:
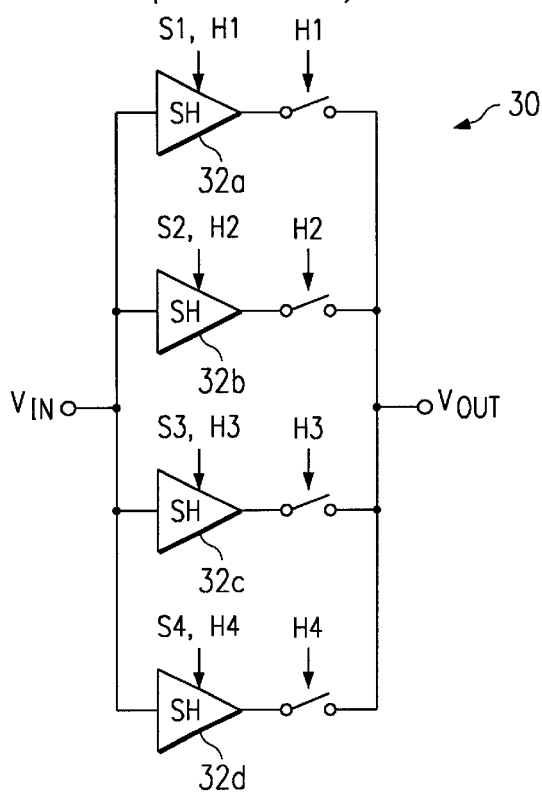
FIG. 3 is a simplified schematic diagram illustrating a prior art high speed sample and hold (S/H) circuit having four S/H subcircuits coupled together in parallel.
Figure 5:
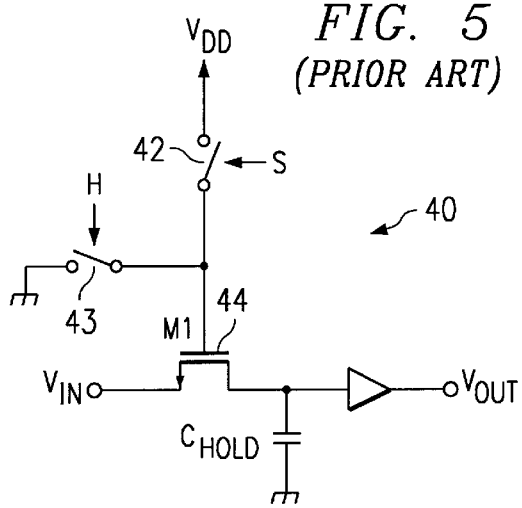
FIG. 5 is a schematic diagram illustrating an exemplary prior art S/H subcircuit used in prior art FIG. 3 used to help illustrate the problem associated with timing mismatch in prior art high speed S/H circuits.
Figure 4:
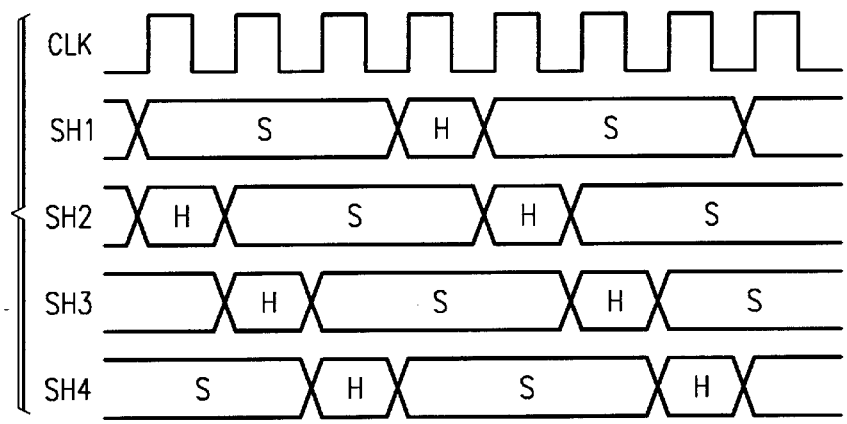
FIG. 4 is a timing diagram illustrating an exemplary timing operation for the four S/H subcircuits of prior art FIG. 3.

As discussed previously in conjunction with prior art FIG. 3, there is a delay between a CLK edge and the sampling instant when a hold signal's ("H") rising edge closes switch 114, causing transistor M1 to turn off. Timing mismatch occurs between the S/H subcircuits 102a–102d when this delay is not exactly the same for all subcircuits. The present invention reduces or eliminates altogether such timing mismatch by modifying the timing of the hold signal used to activate the switch 114 ($H_{(MOD)}$) for each S/H subcircuit 102a–102d.

In the S/H subcircuit 102a of FIG. 8, the $F_{TEST}$ signal is fed into the subcircuit input and its state is "held" based on the timing of the hold signal "H". Therefore by analyzing the output $V_{OUT}$ in a sample and hold cycle in conjunction with one or more of the other subcircuit outputs in the signal processing and analysis discussion highlighted supra, the calibration circuit 104 modifies the hold signal in response thereto so as to establish the desired predetermined timing relationship between the various subcircuits (and thus minimize the energy spikes at the predetermined frequencies in the energy spectra).

Figure 9:
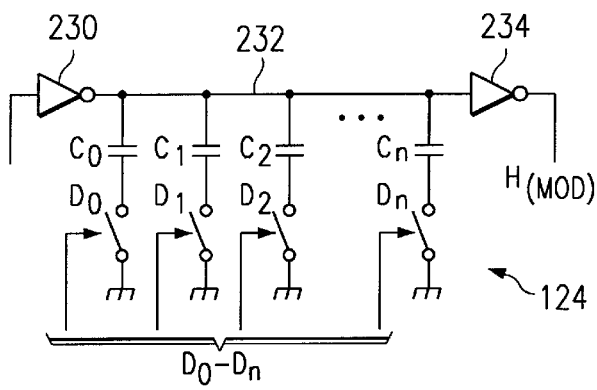
FIG. 9 is a block diagram illustrating an exemplary calibration circuit for modifying a hold signal for the S/H subcircuit of FIG. 8 according to the present invention.

According to one exemplary aspect of the present invention, the calibration circuit 104 modifies the hold signal by adding delay thereto. Various circuits may be employed to delay or otherwise modify the hold signal and any such circuit is contemplated as falling within the scope of the present invention. One exemplary delay circuit 124 is illustrated in FIG. 9. The delay circuit 124 includes a first inverter 230 which takes the incoming hold signal and inverts the signal to $H_{(bar)}$. The output of the first inverter 230 has a plurality of selectively employable capacitive loading elements 232 which act to delay the inverted hold signal ($H_{(bar)}$) by various amounts depending upon the number of elements coupled thereto.

The capacitive loading elements 232 include a plurality of capacitors $C_0$—$C_n$, in series with switches $SW_o$—$SW_n$, respectively, which are controlled by the control signals or control data $D_0$—$D_n$ from a control circuit or the memory 109 (not shown). When a control signal activates a switch (e.g., switch $SW_0$), the associated capacitor $C_0$ is coupled to the output of the first inverter 230, thereby adding a delay to $H_{(bar)}$. As can be seen from FIG. 9, if all the switches are open, then the delay associated with H is negligible, whereas if the control signals $D_0$—$D_n$ dictate that all the switches are closed, a maximum hold signal delay will be effectuated. The delayed $H_{(bar)}$ signal is then reinverted back as a modified hold signal ($H_{(MOD)}$) via a second inverter 234. As shown above, N capacitors of the same size provide for N different delays. Alternatively, if greater resolution is desired for modifying the hold signal, the capacitors may be sized differently from one another so as to provide different amounts of delay. For example, if the capacitor sizes are weighted in a binary fashion, $2^N$ different delays may be achieved, as may be desired.

Therefore as discussed previously, the control data saved in the memory 109 may be used to modify the timing of the hold signal for each of the S/H subcircuits. In addition, since timing mismatch may vary as a function of temperature, the calibration process described supra may be utilized to generate different sets of control data based on the circuit temperature, as may be desired.

Figure 10:
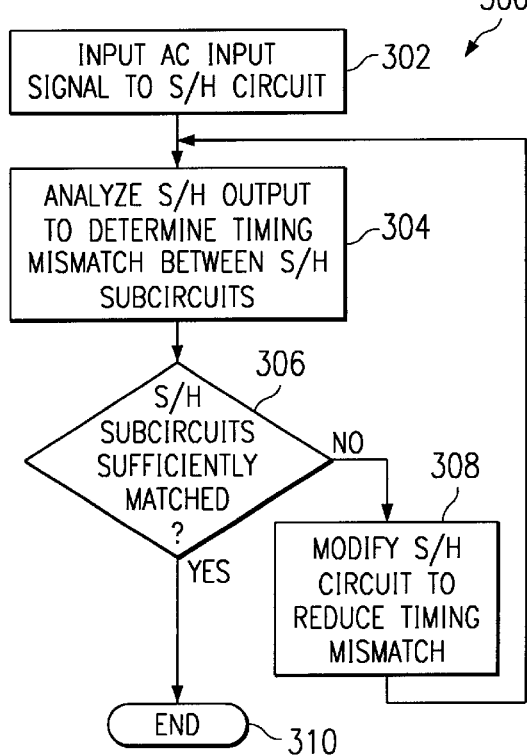
FIG. 10 is a flow chart diagram illustrating a method for reducing timing mismatch in a S/H circuit according to the present invention.

According to yet another aspect of the present invention, a method for reducing timing mismatch in S/H circuits is disclosed, as illustrated in FIG. 10 and designated at reference numeral 300. The method 300 primarily relates to reducing timing mismatch between various time interleaved S/H subcircuits by modifying one or more of the hold signals associated with the S/H subcircuits. The method 300 begins at step 302, wherein an analog input signal, for example, a sinusoidal input signal having a predetermined frequency $f_{TEST}$ is input to the S/H circuit 100. The S/H circuit 100 operates in its conventional manner and generates an output at $V_{OUT}$ which is a function of the input signal. The output signal is then analyzed at step 304 to determine whether timing mismatch exists between the various S/H subcircuits 102a–102d. Since it is relatively uncommon that each of the S/H subcircuits are exactly matched with respect to one another, the method 300 queries whether the existing mismatch is small enough to be considered "sufficiently matched" at step 306. If not (NO at step 306), the method 300 modifies one or more of the S/H subcircuits using, for example, the calibration circuit 104 of FIG. 6a in a manner described supra at step 308. Otherwise (YES at step 306), distortion at the output of the S/H circuit 100 is at or below an acceptable level and the method 300 ends at step 310.

The analysis of the S/H circuit output at step 304 may be pursued in a variety of different analysis methodologies and all such methodologies are contemplated as falling within the scope of the present invention. According to one exemplary aspect of the present invention, step 304 may be executed as illustrated in the flow chart of FIG. 11. Such analysis includes converting the S/H circuit output data into digital data at step 320, for example, by using the ADC 103. The resulting digital data, for example, $D_{OUT}$ of FIG. 6a, is then processed at step 322. According to one exemplary aspect of the present invention, an FFT is performed on the digital data, thereby resulting in an energy spectrum associated therewith.

The processed data of step 322 is then analyzed at predetermined data points to identify whether timing mismatch exists between the various S/H subcircuits 102a–102d at step 324. For example, the FFT may be performed on the digital data using, for example, the DSP circuit 110 at step 322, thereby transforming the data from the time domain to the frequency domain, resulting in an energy spectrum. The energy spectrum is then analyzed at step 324 at one or more predetermined frequencies which are a function of the input test signal frequency and the circuit clock frequency. By analyzing whether or not the energy at the predetermined frequencies are at a minimum value, it may be determined whether or not timing mismatch occurs and if so, between which subcircuits such mismatch exists.

Figure 12:
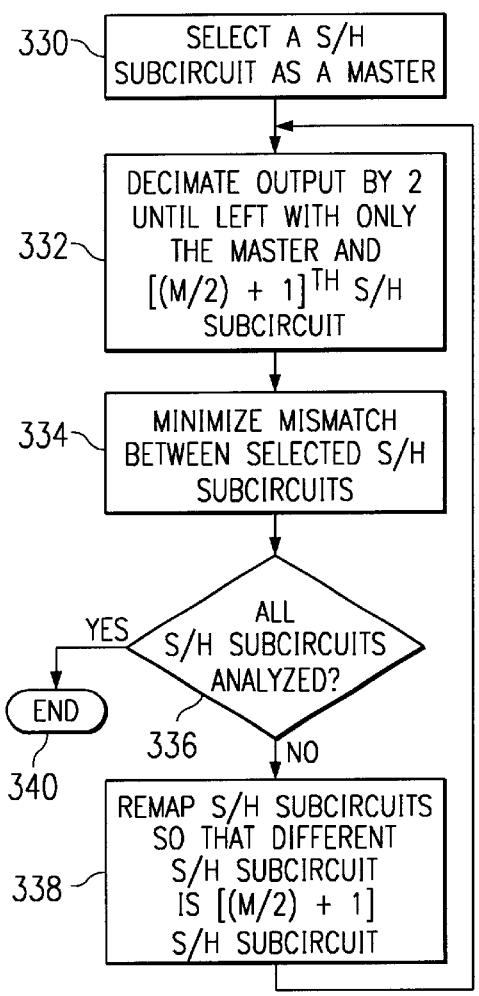
FIG. 12 is a flow chart diagram illustrating a method of analyzing the S/H circuit output data in accordance with one exemplary aspect of the present invention.

According to one exemplary aspect of the present invention, the signal processing of step 322 using the DSP circuit 110 to perform an FFT on the digital data is illustrated in the flowchart of FIG. 12. Initially, a portion of the data associated with one of the S/H subcircuits 102a–102d is selected as the master at step 330 and all the data associated with the other subcircuits will be analyzed with respect to the master individually. In the above manner, the timing mismatch can be subsequently adjusted for in a manner which will not affect the timing relationship of the other subcircuits with respect to the master.

The above analysis methodology is accomplished by decimating the digital output by two at step 332 until the remaining data is only the data associated with the master and the $[(M/12)+1]^{th}$ subcircuit. Thus if M=4 subcircuits, the digital data remaining will be associated with the first and third subcircuits 102a and 102c, respectively. The decimated data is then processed using the DSP to perform an FFT on the decimated data and the resulting spectrum is analyzed so as to identify and minimize the timing mismatch between the two respective S/H subcircuits at step 324.

As discussed supra, the timing mismatch can be minimized by calibrating one or both of the subcircuits by modifying one or both of the hold signals associated therewith.

The analysis (step 322) then continues at step 336 where a query is made whether all the S/H subcircuits have been analyzed. If not (NO at step 336), the various S/H subcircuits (excluding the master) 102b–102d are physically re-assigned at step 338, for example, by re-routing the respective clock signal lines so that the order of the digital data output from the circuit 100 is altered (that is, subcircuit reassignment). The re-ordered digital data is then again decimated at step 332. Since the data was reordered the remaining data may be the data associated with S/H subcircuits 102a and 102d, for example. Step 334 then performs the FFT and analyzes the energy spectrum associated with the decimated data to identify and minimize timing mismatch associated with the selected subcircuits. The steps 332–338 continue until all the subcircuits have been analyzed with respect to the master (YES at step 336), at which point the analysis at step 322 is complete at step 340.

Figure 11:
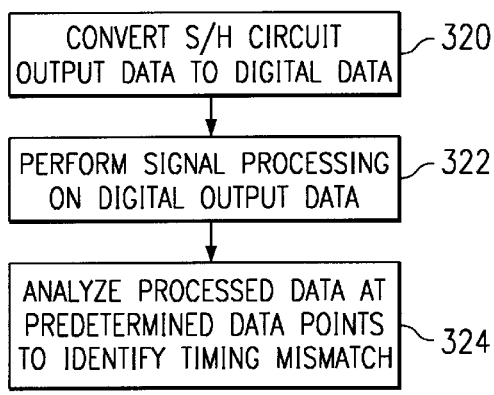
FIG. 11 is a flow chart diagram illustrating a method of analyzing the S/H circuit output to identify timing mismatch according to the present invention.
Figure 13:
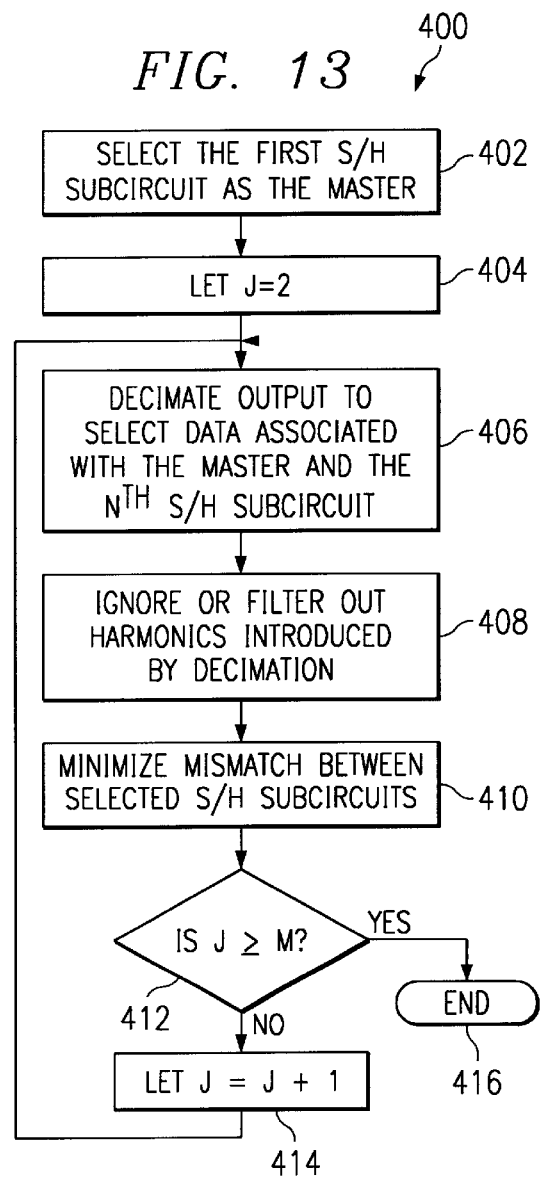
FIG. 13 is a flow chart diagram illustrating a method of analyzing the S/H circuit output data in accordance with another exemplary aspect of the present invention.

According to yet another aspect of the present invention, the processing and analysis step 322 of FIG. 11 may be performed in another manner, as illustrated in the flow chart of FIG. 13, and designated at reference numeral 400. The processing and analysis still includes performing an FFT on the digital data, but the details in which such processing is performed is different. Initially, one of the S/H subcircuits, for example, the first subcircuit 102a, is selected as the master at step 402. Then an integer variable used for counting, for example, J, is initialized and given an initial value of two (2) at step 404. The variable will be utilized in the subsequent decimation process as will be described in greater detail below.

The digital output data $D_{OUT}$ from the S/H circuit 100 is decimated at step 406 by selecting the data associated with the master and the Jth subcircuit, which is presently the second subcircuit 102b since J=2 (e.g., 12121212 ... ). The decimated data is then processed. However, due to the decimation, harmonics may be introduced into the resulting energy spectrum which may mask the harmonics associated with the timing mismatch (which is the purpose of the analysis). Therefore the harmonics associated with the decimation process are ignored or filtered out of the resulting energy spectrum at step 408. The resulting filtered energy spectrum is then analyzed and used to identify and minimize timing mismatch between the two selected subcircuits (as selected by the decimation process) at step 410.

An example of this is shown in FIGS. 7c and 7d. FIG. 7c shows the output spectrum for 12121212 ... decimation where there are no offsets. Spikes labeled 143a–143d represent distortion due to the decimation. These spikes are filtered out. In FIG. 7d, the output spectrum for 12121212 ... decimation is shown where there are offsets.

Spikes 153a–153d are due to decimation and are ignored. Spikes 152 are due to timing mismatch and are minimized by the calibration algorithm.

The method 400 then continues with the query at step 412 whether the integer J is greater than or equal M, wherein M represents the total number of subcircuits (e.g., M =4). If not (NO at step 412), all the subcircuits have not yet been analyzed and the subcircuit variable J is then incremented at step 414 so that J=3. The decimation step 406 is then repeated so that the data associated with the first and third S/H subcircuits are maintained (e.g., 1313131313 ... ). Steps 406–414 continue repeating until J>M at step 412 (all the subcircuits 102a–102d have been analyzed), at which point the method 400 ends at step 416.

Although the analog signal paths in the above description have been shown and described as single-ended, implementations which use differential analog signal paths may also be employed and are contemplated as falling within the scope of the present invention.

Although the technique described above is described as taking place when the circuit is first turned on, it can also be applied at regular or irregular intervals during the ADC's operation, depending upon the requirements of the system in which it is used. Such use is contemplated as falling within the scope of the present invention. Furthermore, although the technique described above is described as taking place during an ADC calibration period during which the ADC is not generating an output, it can also be performed in the background if an additional S/H subcircuit or subcircuits are available. Such operation is contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A high speed sample and hold circuit, comprising:
   a plurality of sample and hold subcircuits coupled in parallel between an input and an output;
   a memory associated with the plurality of sample and hold subcircuits, wherein the memory contains calibration data; and
   a calibration circuit coupled to the plurality of sample and hold subcircuits, wherein the calibration circuit is operable to modify a hold signal using the calibration data for one or more of the plurality of sample and hold subcircuits, thereby reducing a timing mismatch between the plurality of sample and hold subcircuits and distortion associated therewith.

2. The sample and hold circuit of claim 1, wherein the calibration circuit comprises a sub-calibration circuit for modifying the hold signal for each sample and hold subcircuit, respectively.

3. The sample and hold circuit of claim 1, wherein the calibration circuit is selectively coupled to the plurality of sample and hold subcircuits, wherein in a first state the sample and hold circuit is in a calibration mode, wherein the calibration circuit is coupled to the plurality of sample and hold subcircuits, and in a second state the sample and hold circuit is in an operating mode, wherein the calibration circuit is decoupled from the plurality of sample and hold subcircuits.

4. The sample and hold circuit of claim 1, wherein the calibration circuit is operable to delay the hold signal for one or more of the plurality of sample and hold subcircuits, respectively.

5. The sample and hold circuit of claim 1, wherein the calibration circuit comprises:
   a sample and hold subcircuit output detection circuit;
   a control circuit coupled to the detection circuit; and
   a modification circuit coupled to the control circuit,
   wherein the detection circuit is operable to detect a status of an output of a sample and hold subcircuit, and wherein the control circuit is operable to generate one or more control signals in response to the detected status, and wherein the modification circuit is operable to modify the timing of the hold signal in response to the one or more control signals.

6. The sample and hold circuit of claim 5, wherein the detection circuit is an analog to digital converter.

7. The sample and hold circuit of claim 5, wherein the modification circuit comprises a hold signal delay circuit which is operable to delay the hold signal in response to the one or more control signals.

8. The sample and hold circuit of claim 7, wherein the hold signal delay circuit comprises a multi-delay circuit having a hold signal input and a hold signal output, wherein a delay between the input and the output is a function of the one or more control signals.

9. The sample and hold circuit of claim 8, wherein the multi-delay circuit comprises:
   a first inverter circuit coupled to the hold signal input, wherein an output of the first inverter circuit comprises an inverted hold signal;
   one or more selectively coupled delay elements coupled to the output of the first inverter, and wherein a number of the delay elements which are coupled to the first inverter circuit output is a function of the one or more control signals; and a second inverter circuit having an input coupled to the one or more selectively coupled delay elements, and further comprising an output, wherein the output of the second inverter circuit comprises an inversion of the inverted hold signal having a delay associated therewith, and wherein the delay is a function of the number of delay elements coupled thereto via the one or more control signals.

10. The sample and hold circuit of claim 9, wherein the delay elements comprise capacitors.

11. A high speed sample and hold circuit, comprising:

a plurality of sample and hold subcircuits coupled together in parallel between an input and an output;

a memory associated with the plurality of sample and hold subcircuits, wherein the memory contains calibration data; and a calibration subcircuit associated with each of the sample and hold subcircuits, respectively, wherein each calibration subcircuit is operable to modify a hold signal associated therewith using the calibration data, thereby reducing a timing mismatch between the plurality of sample and hold subcircuits and minimizing a distortion associated therewith.

12. The sample and hold circuit of claim 11, wherein each calibration subcircuit is selectively coupled to a sample and hold subcircuit, respectively, and wherein when decoupled from the respective sample and hold subcircuit, the sample and hold subcircuit operates in a normal manner, and when the calibration subcircuits are coupled, respectively, the calibration subcircuits are operable to modify the hold signals, respectively.

13. The sample and hold circuit of claim 11, wherein in a calibration mode, the sample and hold circuit is further operable to receive a sinusoidal test signal as an input to each of the sample and hold subcircuits, and is operable to generate an output for each sample and hold subcircuit using each hold signal, respectively, and wherein each calibration subcircuit is operable to modify its respective hold signal to minimize timing mismatch in accordance with a predetermined criteria.

14. The sample and hold circuit of claim 11, further comprising:

a signal analysis circuit operable to identify a timing mismatch condition among the sample and hold subcircuits; and a control circuit operably coupled to the signal analysis circuit and operable to generate one or more control signals in response to the timing mismatch.

15. The sample and hold circuit of claim 14, wherein the signal analysis circuit comprises a digital signal processing circuit adapted to perform a Fourier transform on the output of the sample and hold circuit and generate an energy spectrum associated therewith.

16. The sample and hold circuit of claim 14, further comprising an analog to digital converter operable to convert the output of the sample and hold circuit to digital data for processing by the digital signal processing circuit.

17. The sample and hold circuit of claim 14, wherein the delay circuit is operable to delay the hold signal for the respective sample and hold subcircuit by capacitively loading a node associated with the hold signal, wherein an amount of capacitive loading is a function of the one or more control signals.

18. A method of reducing timing mismatch in a high speed, parallel coupled sample and hold circuit, comprising the steps of:

detecting timing mismatch associated with a plurality of sample and hold subcircuits;

modifying a hold signal for one or more of a plurality of sample and hold subcircuits within the sample and hold circuit; and utilizing the modified hold signals to operate the sample and hold subcircuits, respectively.

19. The method of claim 18, wherein the step of detecting timing mismatch associated with the plurality of sample and hold subcircuits comprises:

converting output data associated with the sample and hold circuit to digital data;

performing signal processing on the digital data; and analyzing the processed digital data and determining whether timing mismatch exists using such analysis.

20. The method of claim 19, wherein the step of performing signal processing on the digital data comprises performing a Fourier transform on the digital data.

21. The method of claim 20, wherein the Fourier transform comprises a fast Fourier transform.

22. The method of claim 19, wherein the step of analyzing the processed digital data comprises:

evaluating a frequency spectrum associated with the processed signal data; and determining whether timing mismatch exists based on the frequency spectrum.

23. The method of claim 22, wherein the step of analyzing the processed digital data further comprises:

evaluating the frequency spectrum at one or more predetermined frequencies; and determining that timing mismatch exists between the sample and hold subcircuits if an amplitude of the frequency spectrum exceeds a predetermined threshold value.

24. The method of claim 19, wherein the step of performing signal processing on the digital data comprises:

selecting a portion of the digital data associated with one of the sample and hold subcircuits and established the one of the sample and hold subcircuits as a master;

selecting another portion of the digital data associated with another one of the sample and hold subcircuits;

performing a fast Fourier transform on the selected portions of digital data, thereby generating an energy spectrum associated therewith.

25. The method of claim 24, wherein the step of performing signal processing on the digital data further comprises the steps of:

(a) selecting yet another portion of the digital data associated with one of the previously unselected sample and hold subcircuits;

(b) performing a fast Fourier transform on the yet another portion of digital data and the data associated with the master sample and hold subcircuit, thereby generating an energy spectrum associated therewith; and (c) repeating steps (a) and (b) until all of the data associated with the sample and hold subcircuits have been selected and processed.

26. The method of claim 19, wherein a number of sample and hold subcircuits is M, wherein M is an integer greater than one, and wherein performing signal processing on the digital data comprises:

selecting a portion of the digital data associated with one of the sample and hold subcircuits, wherein the one sample and hold subcircuit comprises a master;

decimating the digital data by two until a remaining portion of digital data comprises digital data remains, wherein the remaining portion is associated with the master sample and hold subcircuit and the $[(M/2)+1]^{th}$ sample and hold subcircuit; and performing a fast Fourier transform on the remaining portion of digital data, thereby generating an energy spectrum associated with master and the $[(M/2)+1]^{th}$ sample and hold subcircuits.

27. The method of claim 26, wherein performing signal processing on the digital data further comprises:

(a) reassigning the sample and hold subcircuits, excluding the master sample and hold subcircuit;

(b) converting output data associated with the reassigned sample and hold circuit to digital data;

(c) selecting the portion of the digital data associated with the master sample and hold subcircuit;

(d) decimating the digital data by two until a remaining portion of digital data comprises digital data remains, wherein the remaining portion is associated with the master sample and hold subcircuit and the $[(M/2)+1]^{th}$ sample and hold subcircuit;

(e) performing a fast Fourier transform on the remaining portion of digital data, thereby generating an energy spectrum associated with master and the $[(M/2)+1]^{th}$ sample and hold subcircuits; and (f) repeating the steps (a)–(e) until all the digital data associated with the sample and hold subcircuits have been processed.

28. The method of claim 27, wherein the step of reassigning the sample and hold subcircuits comprises re-routing a plurality of clock signal lines associated with the sample and hold subcircuits therebetween.

* * * * *